(12) United States Patent
Rölle et al.

(10) Patent No.: US 8,715,889 B2
(45) Date of Patent: *May 6, 2014

(54) PHOTOPOLYMER COMPOSITIONS AS PRINTABLE FORMULATIONS

(75) Inventors: Thomas Rölle, Leverkusen (DE); Friedrich-Karl Bruder, Krefeld (DE); Thomas Fäcke, Leverkusen (DE); Marc-Stephan Weiser, Leverkusen (DE); Dennis Hönel, Zülpich (DE); Roland Künzel, Leverkusen (DE)

(73) Assignee: Bayer MaterialScience AG, Leverkusen (DE)

( * ) Notice: Subject to any disclaimer, the term of this patent is extended or adjusted under 35 U.S.C. 154(b) by 0 days.

This patent is subject to a terminal disclaimer.

(21) Appl. No.: 13/201,004

(22) PCT Filed: Feb. 2, 2010

(86) PCT No.: PCT/EP2010/000618
§ 371 (c)(1),
(2), (4) Date: Aug. 11, 2011

(87) PCT Pub. No.: WO2010/091807
PCT Pub. Date: Aug. 19, 2010

(65) Prior Publication Data
US 2011/0311906 A1 Dec. 22, 2011

(30) Foreign Application Priority Data
Feb. 12, 2009 (EP) .................. 09001949

(51) Int. Cl.
*G03H 1/02* (2006.01)
*C08G 18/10* (2006.01)
*C08G 18/48* (2006.01)
*C08G 18/67* (2006.01)
*C08G 18/77* (2006.01)
*C08G 18/78* (2006.01)
*G11B 7/253* (2013.01)
*G11B 7/245* (2006.01)

(52) U.S. Cl.
CPC *G03H 1/02* (2013.01); *G11B 7/253* (2013.01); *G03H 2260/12* (2013.01); *G03H 2260/30* (2013.01); *C08G 18/10* (2013.01); *C08G 18/48* (2013.01); *C08G 18/67* (2013.01); *C08G 18/77* (2013.01); *C08G 18/78* (2013.01); *G11B 7/245* (2013.01)
USPC ........................................ 430/1; 430/2; 359/3

(58) Field of Classification Search
None
See application file for complete search history.

(56) References Cited

U.S. PATENT DOCUMENTS 4,959,284 A 9/1990 Smothers et al.
6,103,454 A 8/2000 Dhar et al.
(Continued)

FOREIGN PATENT DOCUMENTS

DE 102004030019 A1 1/2006
EP 0223587 A1 5/1987
(Continued)

OTHER PUBLICATIONS
"Products and Properties, Reactive Adhesives, Commercial and trial products", Bayer MaterialScience, 20 pages (May 2006).*
(Continued)

*Primary Examiner* — Martin Angebranndt
(74) *Attorney, Agent, or Firm* — Novak Druce Connolly Bove + Quigg LLP

(57) ABSTRACT

The invention relates to applying novel photo polymers based on special urethane acrylates as writing monomers in printing methods which are suitable for producing holographic media, in particular for the visual display of images.

16 Claims, 2 Drawing Sheets

Plot of the Bragg curve η according to Kogelnik (dashed line), of the measured diffraction efficiency (solids circles) and of the transmitted power (black solid line) against the angle detuning ΔΩ. Since, owing to geometric shrinkage and the change in the average refractive index during the photopolymerization, the angle at which DE is measured differs from α, the x axis is centred around the shift. The shift is typically 0° to 2°.

(56) References Cited

U.S. PATENT DOCUMENTS

| | | |
|---|---|---|
| 2003/0035917 A1* | 2/2003 | Hyman .................... 428/67 |
| 2005/0222365 A1* | 10/2005 | Mager et al. .............. 528/73 |
| 2006/0166104 A1* | 7/2006 | Setthachayanon et al. ....... 430/1 |
| 2006/0292453 A1* | 12/2006 | Ueda et al. ................. 430/1 |
| 2007/0077498 A1 | 4/2007 | Yumoto et al. |
| 2008/0008939 A1* | 1/2008 | Klug et al. ................. 430/2 |
| 2008/0188615 A1* | 8/2008 | Jenninger et al. .......... 524/590 |
| 2008/0312403 A1* | 12/2008 | Stockel et al. .............. 528/59 |
| 2009/0041943 A1* | 2/2009 | Ogawa et al. ............ 427/385.5 |
| 2010/0086860 A1 | 4/2010 | Roelle et al. |
| 2010/0086861 A1* | 4/2010 | Weiser et al. ............... 430/2 |
| 2010/0087564 A1* | 4/2010 | Weiser et al. .............. 522/95 |
| 2010/0112458 A1* | 5/2010 | Knocke ...................... 430/2 |
| 2010/0112459 A1 | 5/2010 | Weiser et al. |
| 2010/0203241 A1* | 8/2010 | Weiser et al. .............. 427/162 |
| 2011/0189591 A1 | 8/2011 | Weiser et al. |
| 2011/0207029 A1* | 8/2011 | Hagen et al. ................ 430/2 |
| 2011/0311905 A1* | 12/2011 | Honel et al. ................ 430/2 |
| 2012/0219884 A1* | 8/2012 | Weiser et al. ............... 430/2 |
| 2012/0231376 A1* | 9/2012 | Rolle et al. ................. 430/2 |

FOREIGN PATENT DOCUMENTS

| | | |
|---|---|---|
| EP | 0352774 A1 | 1/1990 |
| EP | 1002817 A2 | 5/2000 |
| EP | 2172502 A1 | 4/2010 |
| EP | 2172505 A1 | 4/2010 |
| WO | WO-03/014178 A1 | 2/2003 |
| WO | WO-03/023520 A2 | 3/2003 |
| WO | WO-2005/124456 A2 | 12/2005 |
| WO | WO-2008/125199 A1 | 10/2008 |
| WO | WO-2010/037496 A1 | 4/2010 |
| WO | WO-2010/037515 A1 | 4/2010 |

OTHER PUBLICATIONS

Prepolymers: Products and applications, Bayer MaterialScience (20 pages) Mar. 2009.*

Coatings Raw Materials Index, Bayer MaterialsScience (24 pages) (Oct. 2009—Baidu website).*

O'Neill, F.T., *Comparison of holographic photopolymer materials by use of analytic nonlocal diffusion models* (2002), vol. 41, No. 5, pp. 845-852.

Luo, S., et al., *Photochromic diarylethene for rewritable holographic data storage* (2005), vol. 13, No. 8, pp. 3124-3128, Optics Express.

Coufal, H.J., et al., *Holographic Data Storage* (2000), vol. 76, pp. 209-228, Bieringer (Springer Series in Optical Sciences).

Logemann, H., *Methoden der organische Chemie [Methods of Organic Chemistry]* 1961, 4th Edition, vol. XIV/1, p. 433, et seq., Georg Thieme Verlag, Stuttgart.

Cunningham, A., et al., *Acid-Stable Dye-Borate Electron Transfer Photoinitiators* (1998), RadTech '98 North America UV/EB Conference Proceedings, Chicago, Apr. 19-22, 1998.

Kogelnik, H., *Coupled Wave Theory for Thick Hologram Gratings* (1969), The Bell System Technical Journal, vol. 48, No. 9, pp. 2909-2947.

* cited by examiner

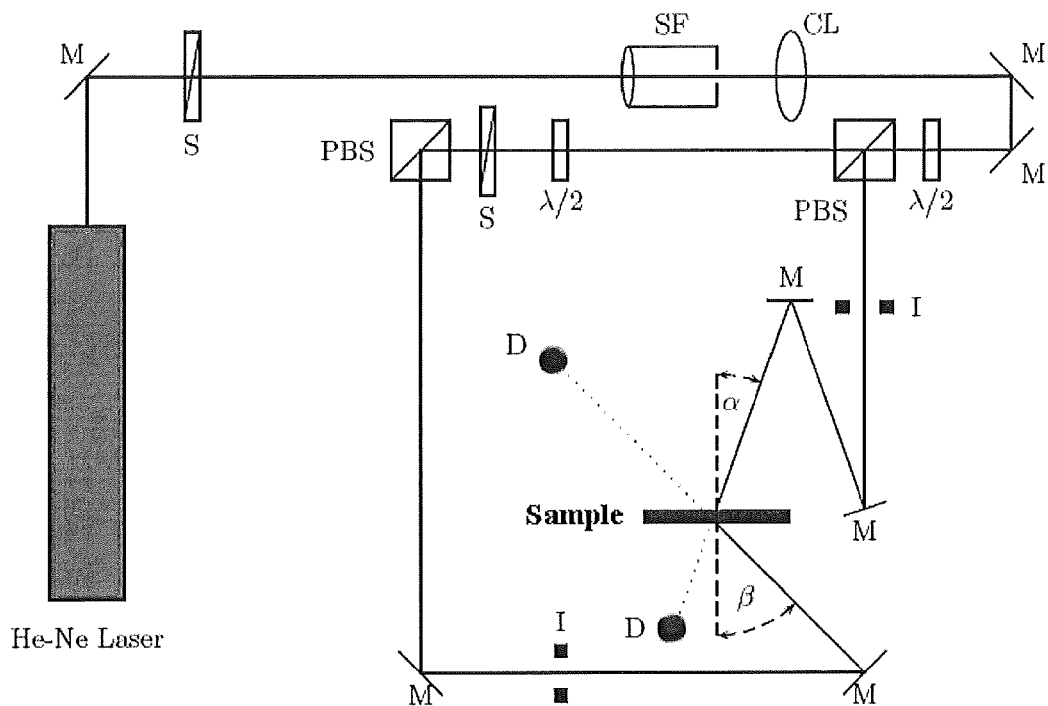
Figure 1: Geometry of a holographic media tester at λ = 633 nm (He-Ne laser) providing a reflection hologram: M = mirror, S = shutter, SF = spatial filter, CL = collimator lens, λ/2 = λ/2 plate, PBS = polarization-sensitive beam splitter, D = detector, I = iris diaphragm, α = 21.8° and β = 41.8° are the angles of incidence of the coherent beams, measured outside the sample (outside the medium).

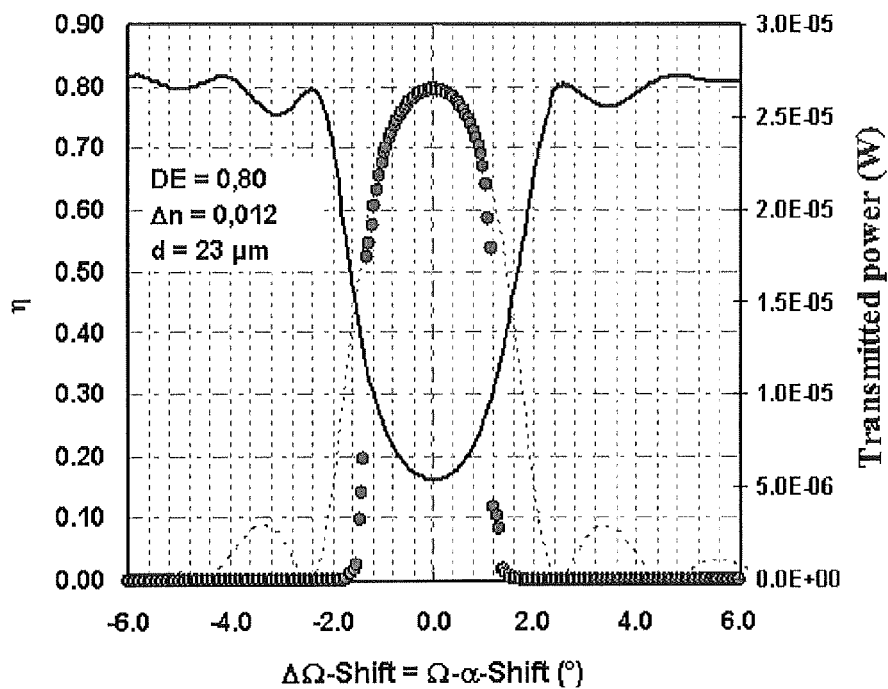

Figure 2: Plot of the Bragg curve $\eta$ according to Kogelnik (dashed line), of the measured diffraction efficiency (solids circles) and of the transmitted power (black solid line) against the angle detuning $\Delta\Omega$. Since, owing to geometric shrinkage and the change in the average refractive index during the photopolymerization, the angle at which DE is measured differs from $\alpha$, the x axis is centred around the shift. The shift is typically 0° to 2°.

PHOTOPOLYMER COMPOSITIONS AS PRINTABLE FORMULATIONS

CROSS-REFERENCE TO RELATED APPLICATIONS

This application is a national stage application (under 35 U.S.C. §371) of PCT/EP2010/000618, filed Feb. 2, 2010, which claims benefit of European application 09001949.8, filed Feb. 12, 2009, both of which are incorporated herein by reference in their entirety for all their useful purposes.

BACKGROUND

The invention relates to the application of novel photopolymers based on specific urethane acrylates as writing monomers, which are suitable in the production of holographic media, in particular for the visual display of images, in printing processes.

Photopolymers are materials which can be exposed by means of the superposition of two coherent light sources, resulting in a three-dimensional structure in the photopolymers which can be described in general by a regional change of the refractive index in the material. Such structures are referred to as holograms. They may also be described as diffractive optical elements. The optical functions developed by such a hologram depends on the specific exposure to light.

For the use of photopolymers as supports of holograms for optical applications in the visible range, as a rule colourless or only very faintly coloured materials having a high diffraction effect are required after the exposure to light. Since the beginnings of holography, silver halide films, in particular those having high resolution, have been used for this purpose. Dichromate gelatine (DCG), dichromate salt-containing gelatine films or mixed forms of silver halide and DCG are also used. Both materials require a chemical aftertreatment for the formation of a hologram, which gives rise to additional costs for industrial processes and necessitates the handling of chemical developer solutions. Moreover, wet chemical methods result in swelling and subsequently shrinkage of the film, which may lead to colour shifts in the holograms, which is undesired.

U.S. Pat. No. 4,959,284 describes photopolymers which consist, inter alia, of a thermoplastic, such as polyvinyl acetate, cellulose acetobutyrate or polymethyl methacrylate-styrene copolymers, which are soluble in organic solvents, a photoinitiator and at least one vinyl cyclopropane derivative. EP352774A1 moreover describes monomers containing other vinyl groups constituted as N-vinylpyrrolidone, phenoxyethyl acrylate and acrylates of triols, such as trimethylolpropane (TMPTA) and ethoxylated trimethylolpropane (TMPEOTA), or other acrylates or acrylamides. It is known in the industry that such photopolymers show usable holograms only after relatively long thermal treatment. O'Neill et al. (Applied Optics, Vol. 41, No. 5, page 845 et seq., 2002), in their review article, discuss not only the abovementioned materials but also photopolymers which are obtainable from thermoplastics and acrylamide. In addition to the unfavourable toxicological profile of acrylamide, such products do not show bright holograms.

Holographically active materials which incorporate dyes which change their photosensitivity under the influence of light (Luo et al, Optics Express, Vol. 13, No. 8, 2005, page 3123) are also known. Similarly, Bieringer (Springer Series in Optical Sciences (2000), 76, pages 209-228) describes so-called photoaddressable polymers which are likewise polymer-bound dyes which can be isomerized under the influence of light. Holograms can be incorporated by exposure to light into both classes of substances, and these materials can be used for holographic data storage. However, these products are of course strongly coloured and therefore not suitable for the applications as described above.

Recently, photopolymers obtained not from thermoplastics but from crosslinked polymers were also described: US 020070077498 describes 2,4,6-tribromophenyl acrylate, which is dissolved in a polyurethane matrix. Likewise, U.S. Pat. No. 6,103,454 describes a polyurethane matrix with polymerizable components, such as 4-chlorophenyl acrylate, 4-bromostryrene and vinylnapthalene. These formulations were developed for holographic data storage, a holographic application in which many, but also very weak, holograms readable only by means of electronic detectors are written and read. For optical applications in the entire visible range, such formulations are not suitable.

Moreover, low-viscosity photopolymer formulations (DE102004030019, WO2005124456) which contain a difunctional acrylate with a mixture of natural unsaturated oils, a photoinitiator and an additive are described.

The non-prior-published PCT/EP2008/002464, EP 08017279.4, EP 08017277.8, EP 08017273.7, EP 08017275.2 disclose formulations of urethane acrylates as writing monomers in polyurethane matrices. Starting from these, it has now been found that printing of such photopolymer formulations is possible under certain circumstances.

BRIEF DESCRIPTION OF PREFERRED EMBODIMENTS

The invention therefore relates to polyurethane compositions suitable for printing, comprising
A) a polyisocyanate component, at least containing an NCO-terminated polyurethane prepolymer whose NCO groups are primarily aliphatically bonded and which is based on hydroxy-functional compounds having an OH functionality of 1.6 to 2.05,
B) isocyanate-reactive polyetherpolyols
C) urethane acrylates and/or urethane methacrylates having at least one aromatic structural unit and a refractive index of greater than 1.50 at 405 nm, which are themselves free of NCO groups and OH groups,
D) free radical stabilizers
E) photoinitiators based on combinations of borate salts and one or more dyes having absorption bands which at least partly cover the spectral range from 400 to 800 nm
F) optionally catalysts
G) auxiliaries and additives.

The invention also relates to a process for the production of printed films, in which such polyurethane compositions according to the invention are applied in or as printing ink to a film.

The invention furthermore relates to the film structure of the printed film.

BRIEF DESCRIPTION OF THE DRAWINGS

FIG. 1 illustrates a measuring apparatus for measuring holographic properties.

FIG. 2 illustrates measured data of the diffraction efficiency, the theoretical Bragg curve and the transmitted intensity.

DETAILED DESCRIPTION OF PREFERRED EMBODIMENTS

The prepolymers of component A) which are essential to the invention are obtained in a manner well known per se to the person skilled in the art by reacting monomeric, oligomeric or polyisocyanates A1) with isocyanate-reactive compounds A2) in suitable stoichiometry with optional use of catalysts and solvents.

In this way, NCO-functional prepolymers having urethane, allophanate, biuret and/or amide groups can be prepared.

Suitable polyisocyanates A1) are all aliphatic, cycloaliphatic, aromatic or araliphatic di- and triisocyanates known per se to the person skilled in the art, it being unimportant whether these were obtained by means of phosgenation or by phosgene-free processes. In addition, the relatively high molecular weight secondary products of monomeric di- and/or triisocyanates having a urethane, urea, carbodiimide, acylurea, isocyanurate, allophanate, biuret, oxadiazinetrione, uretdione or iminooxadiazinedione structure, which are well known per se to the person skilled in the art, can also be used, in each case individually or as any desired mixtures with one another.

Preferred monomeric di- or triisocyanates which can be used as component A1) are butylene diisocyanate, hexamethylene diisocyanate (HDI), isophorone diisocyanate (IPDI), trimethylhexamethylene diisocyanate (TMDI), and/or isocyanatomethyl-1,8-octane diisocyanate (TIN). TIN, TMDI and HDI are particularly preferred and HDI is very particularly preferred.

OH-functional compounds having an OH functionality of, preferably, 1.9 to 2.01, particularly preferably 2.0, are used as isocyanate-reactive compounds A2) for the synthesis of the prepolymers.

Oligomeric or polymeric isocyanate-reactive compounds of the above mentioned functionality range are suitable for this purpose, such as low molecular weight short-chain aliphatic, araliphatic or cycloaliphatic diols, i.e. containing 2 to 20 carbon atoms. Examples of such diols are ethylene glycol, diethylene glycol, triethylene glycol, tetraethylene glycol, dipropylene glycol, tripropylene glycol, 1,2-propanediol, 1,3-propanediol, 1,4-butanediol, neopentyl glycol, 2-ethyl-2-butylpropanediol, trimethylpentanediol, positional isomers of diethyloctanediol, 1,3-butylene glycol, cyclohexanediol, 1,4-cyclohexanedimethanol, 1,6-hexanediol, 1,2- and 1,4-cyclohexanediol, hydrogenated bisphenol A (2,2-bis(4-hydroxycyclohexyl)propane), 2,2-dimethyl-3-hydroxypropyl 2,2-dimethyl-3-hydroxypropionate.

Relatively high molecular weight aliphatic and cycloaliphatic polyols of the abovementioned functionality range, such as polyesterpolyols, polyetherpolyols, polycarbonatepolyols, hydroxy-functional acrylic resins, hydroxy-functional polyurethanes, hydroxy-functional epoxy resins or corresponding hybrids, are also suitable.

For example, the difunctional polyadducts of ethylene oxide, propylene oxide, tetrahydrofuran, butylene oxide, and their mixed adducts and graft products, and the polyetherpolyols obtained by condensation of dihydric alcohols or mixtures thereof and the polyetherpolyols obtained by alkoxylation of dihydric alcohols, may be mentioned as such polyetherpolyols. Preferred difunctional polyetherpolyols are poly(propylene oxides), poly(ethylene oxides) and combinations thereof in the form of random or block copolymers and mixtures thereof having a number average molar mass between 200 and 18,000 g/mol, particularly preferably having a number average molar mass between 600 and 8000 g/mol and very particularly preferably having a number average molar mass between 1000 and 4500 g/mol.

Poly(propylene oxides) of the abovementioned functionality range having number average molar masses between 650 g/mol and 4500 g/mol, particularly preferably having number average molar masses between 1000 g/mol and 4100 g/mol and very particularly preferably having number average molar masses between 1900 g/mol and 2100 g/mol are particularly preferably used as A2).

In the prepolymer synthesis, isocyanate according to A1) is reacted with alcohol according to A2) in stoichiometric amounts for the urethanization, a urethane group forming. Suitable alcohols in this case for the reaction with said di-, tri- and polyisocyanates are all oligomeric or polymeric, primary or secondary, difunctional alcohols of the abovementioned type. With regard to the urethane prepolymers, these are preferably ethanediol, di-, tri- or tetraethylene glycol, 1,2-propanediol, di-, tri-, tetrapropylene glycol, 1,3-propanediol, 1,4-butanediol, 1,3-butanediol, 2,3-butanediol, 1,5-pentanediol, 1,6-hexanediol, 2,2-dimethyl-1,3-propanediol, 1,4-dihydroxycyclohexane, 1,4-dimethylolcyclohexane, 1,8-octanediol, 1,10-decanediol, 1,12-dodecanediol, polyethylene glycol, polypropylene glycol, block polymers and/or copolymers of ethylene oxide and propylene oxide and/or other 1-alkene oxides, poly(THF), polyester-, polycarbonate- and polyacrylatepolyols having number average molar masses of up to 10,000 g/mol and any desired mixtures thereof with one another.

In the prepolymer synthesis, for allophanatization, first an isocyanate according to A1) is reacted with an alcohol according to A2) in a stoichiometric ratio to give a urethane, which is then reacted with a further isocyanate, an allophanate forming. In this case, all oligomeric or polymeric, primary or secondary, difunctional alcohols of the type described above are suitable as alcohols for the reaction with said di-, tri- or polyisocyanates to give urethane. For the further reaction to the allophanate, the monomeric di- or triisocyanates HDI, TMDI and TIN are preferably added.

Preferred prepolymers are urethanes or allophanates obtained from aliphatic isocyanate-functional compounds and oligomeric or polymeric isocyanate-reactive compounds, the prepolymers having number average molar masses of 200 to 10,000 g/mol and NCO functionalities of 1.9 to 5.0. Urethanes having NCO functionalities of 1.9 to 2.1 and number average molar masses of 650 to 8200 g/mol, prepared from aliphatic isocyanate-functional compounds and oligomeric or polymeric polyols and allophanates having functionalities of greater than 2.0 to 3.2 or of 3.9 to 4.2 having number average molar masses of 650 to 8200 g/mol, prepared from aliphatic isocyanate-functional compounds and oligomeric or polymeric polyols or any desired mixtures thereof, are particularly preferred. Urethanes having NCO functionalities of 1.9 to 2.1 and number average molar masses of 1900 to 4100 g/mol, prepared from aliphatic isocyanate-functional compounds and oligomeric or polymeric polyols and allophanates having functionalities of greater than 2.0 to 3.2 or of 3.9 to 4.2 having number average molar masses of 1900 to 4100 g/mol, prepared from aliphatic isocyanate-functional compounds and oligomeric or polymeric polyols or any desired mixtures thereof, are very particularly preferred.

The prepolymers described above preferably have residual contents of free monomeric isocyanate of less than 1% by weight, particularly preferably less than 0.5% by weight, very particularly preferably less than 0.2% by weight.

Of course, component A) may contain proportionately further isocyanates apart from the described prepolymers essential to the invention. Aromatic, araliphatic, aliphatic and cycloaliphatic di-, tri- or polyisocyanates are suitable for this purpose. It is also possible to use mixtures of such di-, tri- or polyisocyanates. Examples of suitable di-, tri- or polyisocyanates are butylene diisocyanate, hexamethylene diisocyanate (HDI), isophorone diisocyanate (IPDI), 1,8-diisocyanato-4-(isocyanatomethyl) octane, 2,2,4- and/or 2,4,4- trimethylhexamethylene diisocyanate (TMDI), the isomeric bis(4,4'-isocyanatocyclohexyl)methanes and mixtures thereof having any desired isomer content, isocyanatomethyl-1,8-octane diisocyanate, 1,4-cyclohexylene diisocyanate, the isomeric cyclohexanedimethylene diisocyanates, 1,4-phenylene diisocyanate, 2,4- and/or 2,6-toluylene diisocyanate, 1,5-naphthylene diisocyanate, 2,4'- or 4,4'-diphenylmethane diisocyanate, triphenylmethane 4,4',4''-triisocyanate or derivatives thereof having urethane, urea, carbodiimide, acyl urea, isocyanurate, allophanate, biuret, oxadiazinetrione, uretdione or iminooxadiazinedione structure and mixtures thereof. Polyisocyanates based on oligomerized and/or derivatized diisocyanates, which were freed from excess diisocyanate by suitable processes, in particular those of hexamethylene diisocyanate, are preferred. The oligomeric isocyanurates, uretdiones and iminooxadiazinediones of HDI and mixtures thereof are particularly preferred.

It is optionally also possible for the abovementioned isocyanate component A) completely or proportionately to contain isocyanates, which are reacted completely or partly with blocking agents known to the person skilled in the art from coating technology. The following may be mentioned as an example of blocking agents: alcohols, lactams, oximes, malonic esters, alkyl acetoacetates, triazoles, phenols, imidazoles, pyrazoles and amines, such as, for example, butanone oxime, diisopropylamine, 1,2,4-triazole, dimethyl-1,2,4-triazole, imidazole, diethyl malonate, ethyl acetoacetate, acetone oxime, 3,5-dimethylpyrazole, ε-caprolactam, N-tert-butylbenzylamine, cyclopentanone carboxyethyl ester or any desired mixtures of these blocking agents.

Preferably exclusively the above-described prepolymers essential to the invention are used in A).

Essentially all polyfunctional, isocyanate-reactive polyetherpolyols which preferably have on average at least 1.5 isocyanate-reactive groups per molecule can be used as component B).

Isocyanate-reactive groups in the context of the present invention are preferably hydroxy compounds.

Suitable polyfunctional, isocyanate-reactive compounds of the abovementioned type are, for example, polyester-, polyether-, polycarbonate-, poly(meth)acrylate- and/or polyurethanepolyols, preferably hydroxy-functional polyetherpolyols.

Polyetherpolyols are optionally block polyadducts of cyclic ethers with OH-functional starter molecules. Suitable cyclic ethers are, for example, styrene oxides, ethylene oxide, propylene oxide, tetrahydrofuran, butylene oxide, epichlorohydrin and any desired mixtures thereof.

Polyhydric alcohols having an OH functionality of 2 and primary or secondary amines and aminoalcohols can be used as starters. Examples thereof are ethanediol, di-, tri-, tetraethylene glycol, 1,2-propanediol, di-, tri- or tetrapropylene glycol, 1,3-propanediol, 1,4-butanediol, 1,3-butanediol, 2,3-butanediol, 1,5-pentanediol, 1,6-hexanediol, 2,2-dimethyl-1,3-propanediol, 1,4-dihydroxycyclohexane, 1,4-dimethylolcyclohexane, 1,8-octanediol, 1,10-decanediol, 1,12-dodecanediol, trimethylolpropane, glycerol or any desired mixtures thereof with one another.

Such polyetherpolyols preferably have number average molar masses of 500 to 8500 g/mol, particularly preferably of 1000 to 6500 g/mol and very particularly preferably of 1900 to 4500 g/mol. The OH functionality is preferably 1.5 to 4.0, particularly preferably 1.8 to 3.0.

In addition, aliphatic, aralphatic or cycloaliphatic di-, tri- or polyfunctional alcohols having a low molecular weight, i.e. having molecular weights of less than 500 g/mol, and having short chains, i.e. containing 2 to 20 carbon atoms, are also present as constituents of component B). The use of pure hydroxy-functional polyetherpolyols is preferred.

Preferred compounds of component B) are polypropylene oxides), poly(ethylene oxides) and combinations thereof in the form of random or block copolymers, and block copolymers of propylene oxide and/or ethylene oxide. The proportion of ethylene oxide, based on percent by weight of the total product, is preferably less than 55%, particularly preferably either between 55% and 45% or less than 30% and very particularly preferably less than 10%.

Difunctional polyetherpolyols based on propylene oxide and ethylene oxide, having a proportion of ethylene oxide of less than 10% by weight, based on the total mass of the parent polyether, and a number average molar mass between 2000 and 4200 g/mol, are used as very particularly preferred compounds of component B).

The components A) and B) are used in the preparation of the photopolymer formulation in an OH/NCO ratio to one another of, typically, from 0.9 to 1.2, preferably from 0.95 to 1.05.

In component C), urethane acrylates and/or urethane methacrylates having at least one aromatic structural unit and a refractive index of greater than 1.50 at 405 nm are used. Urethane (meth)acrylates are understood as meaning compounds having at least one acrylate or methacrylate group, which additionally have at least one urethane bond. It is known that such compounds can be obtained by reacting a hydroxy-functional (meth)acrylate with an isocyanate-functional compound.

Examples of isocyanates which can be used for this purpose are aromatic, aralphatic, aliphatic and cycloaliphatic di-, tri- or polyisocyanates. It is also possible to use mixtures of such di-, tri- or polyisocyanates. Examples of suitable di-, tri- or polyisocyanates are butylene diisocyanate, hexamethylene diisocyanate (HDI), isophorone diisocyanate (IPDI), 1,8-diisocyanato-4-(isocyanatomethyl)octane, 2,2,4- and/or 2,4,4-trimethylhexamethylene diisocyanate, the isomeric bis (4,4'-isocyanatocyclohexyl)methanes and mixtures thereof having any desired isomer content, isocyanatomethyl-1,8-octane diisocyanate, 1,4-cyclohexylene diisocyanate, the isomeric cyclohexanedimethylene diisocyanates, 1,4-phenylene diisocyanate, 2,4- and/or 2,6-toluylene diisocyanate, 1,5-naphthylene diisocyanate, 2,4'- or 4,4'-diphenylmethane diisocyanate, 1,5-naphthylene diisocyanate, triphenylmethane 4,4',4''-triisocyanate and tris(p-isocyanatophenyl) thiophosphate or derivatives thereof having a urethane, urea, carbodiimide, acylurea, isocyanurate, allophanate, biuret, oxadiazinetrione, uretdione or iminooxadiazinedione structure and mixtures thereof. Aromatic di-, tri- or polyisocyanates are preferred.

Suitable hydroxy-functional acrylates or methacrylates for the preparation of urethane acrylates are, for example, compounds such as 2-hydroxyethyl (meth)acrylate, polyethylene oxide mono(meth)acrylates, polypropylene oxide mono (meth)acrylates, polyalkylene oxide mono(meth)acrylates, polys-caprolactone) mono(meth)acrylates, such as, for example, Tone® M100 (Dow, Schwalbach, Germany), 2-hydroxypropyl (meth)acrylate, 4-hydroxybutyl (meth)acrylate, 3-hydroxy-2,2-dimethylpropyl (meth)acrylate, hydroxypropyl (meth)acrylate, 2-hydroxy-3-phenoxypropyl acrylate, the hydroxy-functional mono-, di- or tetraacrylates of polyhydric alcohols, such as trimethylolpropane, glycerol, pentaerythritol, dipentaerythritol, ethoxylated, propoxylated or alkoxylated trimethylolpropane, glycerol, pentaerythritol, dipentaerythritol or the industrial mixtures thereof. 2-hydroxyethyl acrylate, hydroxypropyl acrylate, 4-hydroxybutyl acrylate and poly(c-caprolactone) mono(meth)acrylates are preferred.

In addition, are as isocyanate-reactive oligomeric or polymeric unsaturated compounds containing acrylate and/or methacrylate groups alone or in combination with the abovementioned monomeric compounds suitable. The epoxy (meth)acrylates known per se, containing hydroxyl groups and having OH contents of 20 to 300 mg KOH/g or polyurethane (meth)acrylates containing hydroxyl groups and having OH contents of 20 to 300 mg KOH/g or acrylated polyacrylates having OH contents of 20 to 300 mg KOH/g or mixtures thereof with one another and mixtures with unsaturated polyesters containing hydroxyl groups and mixtures with polyester (meth)acrylates or mixtures of unsaturated polyesters containing hydroxyl groups with polyester (meth)acrylates can also be used. Epoxy acrylates containing hydroxyl groups and having a defined hydroxy functionality are preferred. Epoxy (meth)acrylates containing hydroxyl groups are based in particular on reaction products of acrylic acid and/or methacrylic acid with epoxides (glycidyl compounds) of monomeric, oligomeric or polymeric bisphenol A, bisphenol F, hexanediol and/or butanediol or the ethoxylated and/or propoxylated derivatives thereof. Furthermore, epoxy acrylates having a defined functionality, as can be obtained from the known reaction of acrylic acid and/or methacrylic acid and glycidyl (meth)acrylate, are preferred.

Urethane (meth)acrylates of the abovementioned type, which have at least one aromatic structural unit, are preferably used. These urethane (meth)acrylates have refractive indices of, typically, greater than 1.50, preferably greater than 1.55 and very particularly preferably greater than 1.58 at 405 nm.

Particularly preferred compounds to be used as component C) are urethane acrylates and urethane methacrylates based on aromatic isocyanates and 2-hydroxyethyl acrylate, hydroxypropyl acrylate, 4-hydroxybutyl acrylate, polyethylene oxide mono(meth)acrylate, polypropylene oxide mono (meth)acrylate, polyalkylene oxide mono(meth)acrylate and poly(s-caprolactone) mono(meth)acrylates.

In a very particularly preferred embodiment, the adducts of aromatic triisocyanates (very particularly preferably tris(4-phenylisocyanato) thiophosphate or trimers of aromatic diisocyanates, such as toluene diisocyanate) with hydroxyethyl acrylate, hydroxypropyl acrylate, 4-hydroxybutyl acrylate are used as component C). In a further very particularly preferred embodiment, adducts of 3-thiomethylphenyl isocyanate with hydroxyethyl acrylate, hydroxypropyl acrylate, 4-hydroxybutyl acrylate are used as component C.

For example, inhibitors and antioxidants, as described, for example, in "Methoden der organischen Chemie [Methods of Organic Chemistry]" (Houben-Weyl), 4th edition, Volume XIV/1, page 433 et seq., Georg Thieme Verlag, Stuttgart 1961, are suitable as compounds of the component D). Suitable classes of substances are, for example, phenols, such as, for example, 2,6-di-tert-butyl-4-methylphenol, cresols, hydroquinones, benzyl alcohols, such as, for example, benzhydrol, optionally also quinones, such as, for example, 2,5-di-tert-butylquinone, optionally also aromatic amines, such as diisopropylamine or phenothiazine.

2,6-Di-tert-butyl-4-methylphenol, phenothiazine, p-methoxyphenol, 2-methoxy-p-hydroquinone and benzhydrol are preferred.

One or more photoinitiators are used as component E). These are usually initiators which can be activated by actinic radiation and initiate polymerization of the corresponding polymerizable groups. Photoinitiators are commercially distributed compounds known per se, a distinction being made between monomolecular (type I) and bimolecular (type II) initiators. Furthermore, depending on their chemical nature, these initiators are used for free radical, anionic (or), cationic (or mixed) forms for the abovementioned polymerizations.

Type (II) initiators, such as the photoinitiator systems described in EP-A 0223587 and consisting of a mixture of an ammonium arylborate and one or more dyes, are used here. For example, tetrabutylammonium triphenylhexylborate, tetrabutylammonium tris-(3-fluorophenyl)hexylborate and tetrabutylammonium tris-(3-chloro-4-methylphenyl)hexylborate are suitable as ammonium arylborate. Suitable dyes are, for example, new methylene blue, thionine, Basic Yellow, pinacynol chloride, Rhodamin 6G, gallocyanine, ethyl violet, Victoria Blue R, Celestine Blue, quinaldine red, crystal violet, Brilliant Green, Astrazon Orange G, Darrow Red, pyronin Y, Basic Red 29, pyrillium I, cyanine and methylene blue, Azure A (Cunningham et al., RadTech'98 North America UV/EB Conference Proceedings, Chicago, Apr. 19-22, 1998).

Preferred photo initiators E) are mixtures of tetrabutylammonium tetrahexylborate, tetrabutylammonium triphenylhexylborate, tetrabutylammonium tris-(3-fluorophenyl)hexylborate and tetrabutylammonium tris-(3-chloro-4-methylphenyl)hexylborate (component E1)) with dyes, such as, for example, Astrazon Orange G, methylene blue, new methylene blue, Azure A, pyrillium I, Safranin O, cyanine, gallocyanine, Brilliant Green, crystal violet, ethyl violet and thionine (component E2)). The combination of one blue-sensitive, one green-sensitive and one red-sensitive dye (e.g. Astrazon Orange G, ethyl violet and new methylene blue) and one of the above mentioned borate salts is particularly preferred.

Optionally one or more catalysts may be used as compounds of component F). These are catalysts for accelerating the urethane formation. Known catalysts for this purpose are, for example, tin octanoate, zinc octanoate, dibutyltin dilaurate, dimethylbis[(1-oxoneodecyl)oxy]stannane, dimethyltin dicarboxylate, zirconium bis(ethylhexanoate), zirconium acetylacetonate or tertiary amines such as, for example, 1,4-diazabicyclo[2.2.2]octane, diazabicyclononane, diazabicycloundecane, 1,1,3,3-tetramethylguanidine, 1,3,4,6,7,8-hexahydro-1-methyl-2H-pyrimido (1,2-a)pyrimidine.

Dibutyltin dilaurate, dimethylbis[(1-oxoneodecyl)oxy]stannane, dimethyltin dicarboxylate, 1,4-diazabicyclo[2.2.2]octane, diazabicyclononane, diazabicycloundecane, 1,1,3,3-tetramethylguanidine, 1,3,4,6,7,8-hexahydro-1-methyl-2H-pyrimido(1,2-a)pyrimidine are preferred.

For the printing application, it is important to use additives G) in order to achieve a printable composition which also gives a satisfactory printed image. These may be, for example, additives customary in the area of coating technology, such as solvents, plasticizers, levelling agents, antifoams or adhesion promoters. Preferably used plasticizers are liquids having good dissolving properties, low volatility and a high boiling point. Surface active compounds, such as, for example, polydimethylsiloxanes, can be used as levelling agents. It may also be advantageous simultaneously to use a plurality of additives of one type. Of course, it may also be advantageous to use a plurality of additives of a plurality of types.

The photopolymer formulations according to the invention have, in component A), preferably at least 10% by weight, particularly preferably at least 15% by weight and very particularly preferably at least 20% by weight, based on the photopolymer formulations, of the unsaturated urethanes C) essential to the invention, as writing monomers. The proportion of these writing monomers C), based on the total formulation, is, however, preferably not more than 70% by weight, particularly preferably not more than 50% by weight.

In addition to establishing a suitable viscosity adapted to the chosen printing process, the surface tension of the photopolymer formulation should also be adapted for achieving a good printed image, in order to ensure the levelling and the stability of the printed image. This is achieved, for example, by the addition of suitable additives for separation, defoaming or levelling. These can be checked in series experiments by experiments familiar to the person skilled in the art using polyester-modified polydimethylsiloxanes, fluorine-modified polymers, foam-destroying polysiloxanes, hydrophobic solids and emulsifiers, polyether-modified polymethylalkylsiloxane or nonionic polyacrylate copolymers and can be optimized in line with the printing press.

Typical photopolymer compositions comprise:
10 to 30% by weight of the component A),
25 to 74.497% by weight of the component B)
10 to 40% by weight of the component C)
0 to 1% by weight of free radical stabilizers D)
0.5 to 3% by weight of photoinitiators E1)
in each case 0.001 to 0.2% by weight of the three dyes E2), which are tailored in the absorption spectrum to the red, green and blue laser wavelengths
0 to 4% by weight of catalysts F)
5 to 25% by weight of auxiliaries and additives G)
Preferably, the polyurethane compositions according to the invention comprise 15 to 30% by weight of the component A)
30 to 56.96% by weight of the component B),
20 to 35% by weight of the component C)
0.01 to 0.5% by weight of free radical stabilizers D)
1 to 3% by weight of photoinitiators E1)
in each case 0.01 to 0.2% by weight of the three dyes E2), which are tailored in the absorption spectrum to the red, green and blue laser wavelengths
0 to 1% by weight of catalysts F)
7 to 20% by weight of auxiliaries and additives G)
The polyurethane compositions according to the invention particularly preferably comprise 17 to 30% by weight of the component A)
40 to 48.37% by weight of the component B)
25% by weight of the component C)
0.02 to 0.1% by weight of free radical stabilizers D)
1 to 1.5% by weight of photoinitiators E1)
in each case 0.03 to 0.1% by weight of the three dyes E2), which are tailored in the absorption spectrum to the red, green and blue laser wavelengths
0.02 to 0.1% by weight of catalysts F)
8 to 15% by weight of auxiliaries and additives G)

The present invention furthermore relates to the article which is obtained by printing onto a transparent substrate as support layer (I) with the prepolymer-based polyurethane formulation essential to the invention.

Preferred materials or material composites of the support layer (I) are based on polycarbonate (PC), polyethylene terephthalate (PET), polybutylene terephthalate, polyethylene, polypropylene, cellulose acetate, cellulose hydrate, cellulose nitrate, cycloolefin polymers, polystyrene, polyepoxides, polysulfone, cellulose triacetate (CTA), polyamide, polymethyl methacrylate, polyvinyl chloride, polyvinyl butyral or polydicyclopentadiene or mixtures thereof. In addition, material composites, such as film laminates or coextrudates, can be used as support film (I). Examples of material composites are duplex and triplex films having a composition according to one of the schemes A/B, A/B/A or A/B/C, such as PC/PET, PET/PC/PET and PC/TPU (TPU=thermoplastic polyurethane). PC and PET are particularly preferably used as support film (I).

Transparent supports (I) which are optically clear, i.e. not hazy, are preferred. The haze is measureable via the haze value, which is less than 3.5%, preferably less than 1%, particularly preferably less than 0.3%.

The haze value describes the fraction of transmitted light which is scattered in a forward direction by the sample exposed to light. Thus, it is a measure of the opacity or haze of transparent materials and quantifies material defects, particles, inhomogeneities or crystalline phase boundaries in the material or its surface which adversely affect the transparency. The method for measuring the haze is described in the standard ASTM D 1003.

The support (I) preferably has a birefringence which is not too high, i.e. typically a mean optical retardation of less than 1000 nm, preferably of less than 700 nm, particularly preferably of less than 300 nm.

The retardation R is the mathematical product of birefringence $\Delta n$ and the thickness of the support d. The automatic and objective measurement of the retardation is effected using an imaging polarimeter, for example from ilis GmbH, StainMatic® M3/M model.

The retardation is measured in perpendicular incidence. The retardation values stated for the support (I) are lateral mean values.

The support (I), including possible coatings on one or both sides, typically has a thickness of 5 to 2000 µm, preferably 8 to 300 µm, particularly preferably 30 to 200 µm and in particular 125 to 175 µm or 30 to 45 µm.

The photopolymer layers (II) applied by printing preferably have a total layer thickness, based on all photopolymer layers applied in layer (II), of not more than 200 µm, particularly preferably 3 to 100 µm, very particularly preferably 15 to 60 µm.

In addition to the constituents (I) and (II), the film composite may have one or more covering layers (III) on the photopolymer layer (II) in order to protect it from dirt and environmental influences. Plastics films or film composite systems, but also clear coats, can be used for this purpose.

The film materials analogous to the materials used in the support layer are preferably used as covering layers (III), said film materials having a thickness of, typically, 5 to 200 µm, preferably 8 to 125 µm, particularly preferably 20 to 50 µm.

Covering layers (III) having as smooth a surface as possible are preferred. The roughness determined according to DIN EN ISO 4288 "Geometrical Product Specifications (GPS)—Surface Texture . . . ", test condition R3z front and back, is used as a measure. Preferred roughnesses are in the range of less than or equal to 2 µm, preferably less than or equal to 0.5 µm.

PE or PET films having a thickness of 20 to 60 µm are preferably used as covering layers (III); a polyethylene film of 40 µm thickness is particularly preferably used.

Further protective layers, for example a lower lamination of the support film (I), may be used.

The printing process according to the invention for the production of films and coatings and the recording of visual holograms is preferably carried out in such a way that the synthesis components of the polyurethane compositions according to the invention, with the exception of component A) are homogeneously mixed with one another, and component A) is admixed only immediately before the application to the substrate or in the mould.

All pump systems which are known to the person skilled in the art and in particular transport independently of counter pressure, with little pulsation and precisely are suitable for transport and the necessary accuracy for the metering. Accordingly, a diaphragm pump, gear pumps, eccentric screw pumps (Mohno pumps), peristaltic pumps and piston pumps are preferred. Gear pumps and eccentric screw pumps (Mohno pumps) are particularly preferred.

Preferred metered amounts are in the range from 2 ml/min to 1000 ml/min, particularly preferably in the range from 2 ml/min to 100 ml/min All methods and apparatuses known per se to the person skilled in the art from mixing technology, such as, for example stirred tanks or both dynamic and static mixers, can be used for mixing.

However, apparatuses without dead spaces or with only small dead spaces are preferred. Furthermore, methods in which the mixing is effected within a very short time and with very vigorous mixing of the two components to be mixed are preferred. In particular, dynamic mixers, especially those in which the components come into contact with one another only in the mixer, are suitable for this purpose.

The temperatures during this procedure are 0 to 100° C., preferably 10 to 80° C., particularly preferably 20 to 60° C.

If necessary, devolatilization of the individual components or the total mixture under reduced pressure of, for example, 1 mbar can also be carried out. Devolatilization, in particular after addition of the component A), is preferred in order to prevent bubble formation by residual gases in the media obtainable.

Before admixing of the component A), the mixtures can be stored as a storage-stable intermediate product, optionally over several months.

After the admixing of the component A) of the polyurethane compositions according to the invention, a clear, liquid formulation is obtained which, depending on composition, cures at room temperature within a few seconds to a few hours.

The ratio and the type and reactivity of the synthesis components of the polyurethane compositions is preferably adjusted so that the curing after admixing of the component A) occurs within minutes to one hour at room temperature. In a preferred embodiment, the curing is accelerated by heating the formulation after the admixing to temperatures between 30 and 180° C., preferably 40 to 120° C., particularly preferably 50 to 100° C.

The abovementioned adjustment with regard to the curing behaviour is easily possible for a person skilled in the art in the form of routine experiments within the abovementioned quantity range of the components and the synthesis components available in each case for choice, and in particular the preferred synthesis components.

The polyurethane compositions according to the invention have viscosities at 25° C. of, typically, 10 to 100,000 mPa·s, preferably 100 to 20,000 mPa·s, particularly preferably 200 to 10,000 mPa·s, especially preferably 500 to 5000 mPa·s, immediately after complete mixing of all the components, so that they have very good processing properties even in solvent-free form. In solution with suitable solvents, viscosities at 25° C. of below 10,000 mPa·s, preferably below 2000 mPa·s, particularly preferably below 500 mPa·s, can be established.

Polyurethane compositions of the abovementioned type which cure with a catalyst content of 0.004% by weight to 0.1% by weight at 80° C. in less than 6 minutes have proved to be advantageous; concentrations between 0.01% by weight and 0.08% by weight are preferred and concentrations between 0.03% by weight and 0.06% by weight are particularly preferred.

All respective customary printing processes known to the person skilled in the art, such as, in particular, knife coating, casting, printing, screen printing, spraying or inkjet printing, are suitable for application to a substrate. Preferred application methods are screen printing and inkjet printing.

In general, printing processes are understood as meaning procedures and working methods for duplicating two-dimensional originals. In older printing processes, the printing ink is transferred from an original by a printing press onto the material on which printing is to be effected; newer printing processes use digital printing systems for this purpose. The first-mentioned printing processes are divided into printing plate production and print run in the production phases. Depending on the peculiarity of the printing plate, a distinction is made between different printing processes.

In relief printing, all printing parts are raised in a plane, are inked and release the printing ink to the print medium. In letterpress printing, the printing plate consists of letters and/or machine composition lines, stereotypes and electrotypes; in indirect relief printing (letterset printing), the printing plate consists of a generally etched, curved metal plate (wrap-around plate); in flexographic printing (flexography, formerly aniline printing, aniline rubber-plate printing, rubber-plate printing), the printing plate consists of flexible rubber or plastic.

In planographic printing, printing and nonprinting parts of the printing plate are virtually in a plane. The printing plate is chemically treated so that it accepts ink only in the printing parts.

In gravure printing, low-viscosity ink is introduced into the printing wells, and the surface of the printing plate is cleaned again by a doctor blade, whereupon the impression is produced (rotogravure [intaglio printing], intaglio line printing, siderography, etc.).

In screen printing, the printing ink is pressed through a template (stretched screen, for example comprising man made silk, on a printing frame) by means of a squeegee onto the print medium.

In pad printing or indirect gravure printing, the original is transferred with the aid of a pad (comprising porous silicone rubber) from one surface (generally a gravure printing plate) onto another, for example cups, ballpoint pens, and can therefore also be applied into the depression of a deformed print medium.

In stamping, the individual printing plates are pressed onto the print medium.

In frottage, the marble, granite or limestone plate engraved with text serves as a block. A moist paper was placed over this lithographic printing plate and then pressed with cloth into the wells of the engraved texts, after which the paper was brushed with a tusche, the wells remaining white and legible, and a negative copy forming.

In pigmentography, in contrast to pigment printing, soft-ground etching and screen printing processes are to be included at the end as an independent graphic arts process. In the printing technique brought into being by A1 Bernstein in the USA in the 70s as trace print, the individual printing plates are cut and pierced in the positive-negative process, it being possible to print very fine lines and dots, in contrast to pochoir. In the printing process, printing ink, coloured pigments, are brushed through the printing screen by hand and are then fixed.

Bubble-jet printers produce tiny ink drops with the aid of a heating element which heats the water in the ink. This results in the explosive formation of a tiny vapour bubble, which, through its pressure, presses an ink drop out of the nozzle. Two systems are used here: Lexmark and HP in the Deskjet series employs flat nozzle elements which substantially consist of two plates. The plate facing the paper contains a tiny nozzle bore, and the vapour bubble forms opposite this bore (sideshooter). The process is very simple to produce and is therefore economical but has the disadvantage of a limited lifetime of the printing heads. Exchangeable printing heads are used in all of them. In its printers, Canon operates with a bubble-jet technique in which the nozzles are present at right angles to the heating elements (edgeshooter). The process is very similar to the piezo process, except that the expulsion pressure is generated not by a piezoelectric element but by a vapour bubble. The individual heating element operates at a frequency up to 10 kHz.

Piezo printers utilize the piezoelectric effect in piezoelectric ceramic elements to deform under electrical voltage in order to press printing ink through a fine nozzle. The ink forms drops, the drop volume of which can be controlled via the magnitude of the applied electrical pulse. The operating frequency of a piezo crystal ranges up to 23 kHz.

In valve printers, individual valves which open when a drop is to leave the nozzle are mounted on the nozzles.

The present invention furthermore relates to the use of the imprinted articles according to the invention for recording visual holograms, for the production of optical elements, images and displays and a method for recording holograms using the polyurethane compositions according to the invention, and the media or holographic films obtainable therefrom.

With the polyurethane compositions according to the invention, holograms for optical applications in the entire visible range and in the near UV range (300-800 nm) can be produced by appropriate exposure processes. Visual holograms comprise all holograms which can be recorded by methods known to the person skilled in the art, including, inter alia, in-line (Gabor) holograms, off-axis holograms, full-aperture transfer holograms, white light transmission holograms ("rainbow holograms"), Denisyuk holograms, off-axis reflection holograms, edge-lit holograms and holographic stereograms; reflection holograms, Denisyuk holograms, transmission holograms are preferred. Optical elements, such as lenses, mirrors, deflecting mirrors, filters, diffusion screens, diffraction elements, light conductors, waveguides, projection screens and/or masks are preferred. Frequently, these optical elements show a frequency selectivity depending on how the holograms were exposed and which dimensions the hologram has.

In addition, holographic images or displays, such as, for example, for personal portraits, biometric representations in security documents, or generally of images or image structures for advertising, security labels, trade mark protection, trade mark branding, labels, design elements, decorations, illustrations, reward cards, images and the like, and images which can represent digital data, inter alia also in combination with the products described above, can also be produced by means of the polyurethane compositions according to the invention. Holographic images may give the impression of a three-dimensional image, but they can also represent image sequences, short films or a number of different objects, depending on the angle from which they are illuminated, with which light source (including moving ones) they are illuminated, etc. Owing to this variety of design possibilities, holograms, in particular volume holograms, constitute an attractive technical solution for the abovementioned application.

EXAMPLES

Starting Materials:

Desmodur® XP 2599 is an experimental product of Bayer MaterialScience AG, Leverkusen, Germany, full allophanate of hexane diisocyanate on Acclaim 4200, NCO content: 5.6-6.4%

Polyol 1 (Acclaim® 4200) is a polypropylene oxide having a number average molar mass of 4000 g/mol from Bayer MaterialScience AG, Leverkusen, Germany.

Urethane acrylate 1 is an experimental product from Bayer MaterialScience AG, Leverkusen, Germany, urethane acrylate based on 2-hydroxyethyl acrylate and tris(p-isocyanatophenyl) thiophosphate.

Fomrez® UL28: Urethanization catalyst, dimethylbis[(1-oxoneodecyl)oxy]stannane, commercial product of Momentive Performance Chemicals, Wilton, Conn., USA (used as 10% strength solution in N-ethylpyrrolidone).

CGI 909 is an experimental product marketed in 2009 by Ciba Inc., Basel, Switzerland. New methylene blue (zinc-free): dye from Sigma-Aldrich Chemie GmbH, Steinheim, Germany. Ethyl violet: dye from MP Biomedicals LLC, Solon, Ohio, USA.

Astrazon Orange G: dye from Sigma-Aldrich Chemie GmbH, Steinheim, Germany.

Byk 310: silicone-based surface additive from BYK-Chemie GmbH, Wesel, Germany (solution about 25% strength in xylene), number average molar mass about 2200 g/mol.

Measurement of the Diffraction Efficiency DE and Refractive Index Contrast Δn:

The media according to the invention which were produced in the experimental section and comparative media were tested with regard to their holographic properties by means of a measuring arrangement according to FIG. 1:

The laminating film is peeled off the film composite, and the photopolymer material is then laminated with glass so that the substrate film faces outwards.

The beam of an He—Ne laser (emission wavelength 633 nm) was converted with the aid of the spatial filter (SF) and together with the collimation lens (CL) into a parallel homogenous beam. The final cross sections of the signal and reference beam are established by the iris diaphragms (I). The diameter of the iris diaphragm opening is 4 mm The polarization-dependent beam splitters (PBS) split the laser beam into two coherent equally polarized beams. Via the λ/2 plates, the power of the reference beam was adjusted to 0.5 mW and the power of the signal beam to 0.65 mW. The powers were determined using the semiconductor detectors (D) with sample removed. The angle of incidence (α) of the reference beam is 21.8° and the angle of incidence (β) of the signal beam is 41.8°. At the location of the sample (medium), the interference field of the two overlapping beams produced a grating of light and dark strips which are perpendicular to the angle bisectors of the two beams incident on the sample (reflection hologram). The strip spacing in the medium is ~225 nm (refractive index of the medium assumed to be ~1.49).

Holograms were written into the medium in the following manner:

Both shutters (S) are opened for the exposure time t. Thereafter, with shutters (S) closed, the medium was allowed a time of 5 minutes for diffusion of the still unpolymerized writing monomers. The holograms written were now read in the following manner. The shutter of the signal beam remained closed. The shutter of the reference beam was opened. The iris diaphragm of the reference beam was closed to a diameter of <1 mm. This ensured that the beam was always completely in the previously written hologram for all angles (Ω) of rotation of the medium. The turntable, under computer control, covered the angle range from Ω=0° to Ω=20° with an angle step width of 0.05°. At each angle approached, the powers of the beam transmitted in the zeroth order were measured by means of the corresponding detector D and the powers of the beam diffracted in the first order were measured by means of the detector D. The diffraction efficiency η was obtained at each angle Ω approached as the quotient of:

$$\eta = \frac{P_D}{P_D + P_T}$$

$P_D$ is the power in the detector of the diffracted beam and $P_T$ is the power in the detector of the transmitted beam.

By means of the method described above, the Bragg curve (it describes the diffraction efficiency η as a function of the angle Ω of rotation of the written hologram) was measured and was stored in a computer. In addition, the intensity transmitted in the zeroth order was also plotted against the angle Ω of rotation and stored in a computer.

The maximum diffraction efficiency (DE=$\eta_{max}$) of the hologram, i.e. its peak value, was determined. It may have been necessary for this purpose to change the position of the detector of the diffracted beam in order to determine this maximum value.

The refractive index contrast Δn and the thickness d of the photopolymer layer were now determined by means of the Coupled Wave Theory (cf. H. Kogelnik, The Bell System Technical Journal, Volume 48, November 1969, Number 9 page 2909-page 2947) from the measured Bragg curve and the variation of the transmitted intensity as a function of angle. The method is described below:

According to Kogelnik, the following is true for the Bragg curve η/(Ω) of a reflection hologram:

$$\eta = \frac{1}{1 + \frac{1 - (\chi/\Phi)^2}{\sinh^2(\sqrt{\Phi^2 - \chi^2})}}$$

with:

$$\Phi = \frac{\pi \cdot \Delta n \cdot d}{\lambda \cdot \sqrt{\cos(\alpha') \cdot \cos(\alpha' - 2\psi)}}$$

$$\chi = \Delta\theta \cdot \frac{2\pi \cdot \sin(\alpha' - \psi)}{\Lambda \cdot \cos(\alpha' - 2\psi)} \cdot \frac{d}{2}$$

$$\psi = \frac{\beta' - \alpha'}{2}$$

$$\Lambda = \frac{\lambda}{2 \cdot n \cdot \cos(\psi - \alpha')}$$

$$n \cdot \sin(\alpha') = \sin(\alpha), \; n \cdot \sin(\beta') = \sin(\beta)$$

$$\Delta\theta = -\Delta\Omega \cdot \sqrt{\frac{1 - \sin^2(\alpha)}{n^2 - \sin^2(\alpha)}}$$

Φ is the grating thickness, χ is the detuning parameter and Ψ is the angle of tilt of the refractive index grating which was written. α' and β' correspond to the angles of α and β during writing of the hologram, but in the medium. ΔΘ is the angle detuning measured in the medium, i.e. the deviation from the angle α'. ΔΩ is the angle detuning measured outside the medium, i.e. the deviation from the angle α. n is the average refractive index of the photopolymer and was set at 1.504.

The maximum diffraction efficiency (DE=$\eta_{max}$) is then obtained for χ=0, i.e. ΔΩ=0, as:

$$DE = \tanh^2(\Phi) = \tanh^2\left(\frac{\pi \cdot \Delta n \cdot d}{\lambda \cdot \sqrt{\cos(\alpha') \cdot \cos(\alpha' - 2\psi)}}\right)$$

The measured data of the diffraction efficiency, the theoretical Bragg curve and the transmitted intensity are as shown in FIG. 2 plotted against the centred angle rotation Ω-α-shift. Since, owing to geometric shrinkage and the change in the average refractive index during photopolymerization, the angle at which DE is measured differs from α, the x axis is centred around this shift. The shift is typically 0° to 2°.

Since DE is known, the shape of the theoretical Bragg curve according to Kogelnik is determined only by the thickness d of the photopolymer layer. An is subsequently corrected via DE for a given thickness d so that measurement and theory of DE always agree. d is now adapted until the angle positions of the first secondary minima of the theoretical Bragg curve agree with the angle positions of the first secondary maxima of the transmitted intensity and additionally the full width at half maximum (FWHM) for the theoretical Bragg curve and the transmitted intensity agree.

Since the direction in which a reflection hologram concomitantly rotates on reconstruction by means of an Ω scan, but the detector for the diffracted light can detect only a finite angle range, the Bragg curve of broad holograms (small d) is not completely detected in an Ω-scan, but only the central region (with suitable detector positioning). That shape of the transmitted intensity which is complementary to the Bragg curve is therefore additionally used for adapting the layer thickness d.

For a formulation, this procedure was possibly repeated several times with different exposure times t on different media in order to determine the average energy dose of the incident laser beam at which DE reaches the saturation value during writing of the hologram. The average energy dose E is obtained as follows:

$$E \; (\text{mJ/cm}^2) = \frac{2 \cdot [0.50 \; \text{mW} + 0.67 \; \text{mW}] \cdot t(s)}{\pi \cdot 0.4^2 \; \text{cm}^2}$$

The powers of the part-beams were adapted so that the same power density is achieved in the medium at the angles α and β used.

Preparation of the Urethane Acrylate 1:

0.1 g of 2,6-di-tert-butyl-4-methylphenol, 0.05 g dibutyltin dilaurate (Desmorapid Z, Bayer MaterialScience AG, Leverkusen, Germany) and 213.07 g of a 27% strength solution of tris(p-isocyanatophenyl) thiophosphate in ethyl acetate (Desmodur® RFE, product of Bayer MaterialScience AG, Leverkusen, Germany) were initially introduced into a 500 ml round-bottomed flask and heated to 60° C. Thereafter, 42.37 g of 2-hydroxyethyl acrylate were added dropwise and the mixture was further kept at 60° C. until the isocyanate content had fallen below 0.1%. Thereafter, cooling was effected and the ethyl acetate was completely removed in vacuo. The product was obtained as a semicrystalline solid.

For the production of the holographic media, the component C, the component D (which may already have been predissolved in the component C) and optionally the components G and F are dissolved in the component B, optionally at 60° C., and thoroughly mixed. Thereafter, the component E, in pure form or in dilute solution in NEP, is weighed in in the dark or with suitable illumination and mixing is effected again. Optionally, it is heated for not more than 10 minutes in a drying oven to 60° C. The mixture obtained can be devolatilized with stirring at <10 mbar.

The photopolymer formulation thus obtained is applied to the prepared screen for screen printing and then processed in a semiautomatic or fully automatic operation. For this purpose, the printing parameters, such as, for example, the squeegee speed, can be adapted to the printed image. The formulation is pressed through the template (mesh) by means of the squeegee onto the substrate to be printed on. Thereafter, the screen is filled again by means of the flood squeegee and a new cycle is started. After the printing, the substrate is removed from the screen printing press and is dried. This can be carried out in the downstream tunnel drier or separately in a rack trolley or oven.

The imprinted substrates are dried at about 80° C. and then covered with one of the abovementioned covering layers and packed in a light-tight packaging.

The thickness d of the photopolymer layer is obtained from the coating parameters of the corresponding coating device which are known to the person skilled in the art.

The following examples are mentioned for illustrating the method according to the invention but are not intended to be understood as being limiting. Unless noted otherwise, all stated percentages of the photopolymers are based on percent by weight.

Preparation of the Printable Formulation 1

Example 1

13.75 g of urethane acrylate 1, then 0.028 g of Fomrez® UL 28 and 2.75 g of Byk 310 and finally a solution of 0.825 g of CGI 909, 0.028 g of new methylene blue, 0.028 g of ethyl violet and 0.028 g of Astrazon Orange G in 1.95 g of N-ethylpyrilidone were added stepwise in the dark to 26.1 g of polyol 1 and mixed so that a clear solution was obtained. Thereafter, 9.45 g of Desmodur® XP 2599 were added at 30° C. and mixing was effected again. The liquid material obtained was then printed onto 175 μm thick polycarbonate film, dried for 10 minutes at 80° C. and laminated with a PE film.

Printing Example

The above printable formulation was pressed through a screen comprising the fabric PES 80/55 PW (VS-Monoprint Polyester) on a semiautomatic screen printing press AT-80 P from ESC. The open screen area in the case of this fabric is about 31%. In the experiments, it was found that, in this set-up, a slower squeegee speed has produced a better printed image. However this must be viewed in isolation since this is dependent in each case on the entire interplay of the individual components (squeegee rubber, squeegee angle, fabric type, etc.). It was also possible to produce functional patterns with a medium/faster squeegee speed with the AT-80 P.

The following measured values for Δn were obtained at the dose E:

| Example | Screen width  | Squeegee speed | Δn     | Dose (mJ/cm²) |
|---------|---------------|----------------|--------|---------------|
| 1       | 80 mesh fabric | 2             | 0.0083 | 9.23          |
| 2       | 80 mesh fabric | 4             | 0.00   |               |
| 3       | 80 mesh fabric | 8             | 0.00   |               |

The values found for Δn and the required dose show that the photopolymers according to the invention are very suitable as holographic media in the context of the above description. Particularly good holographic media can be obtained if low squeegee speeds are set on a screen printing press.

The invention claimed is:

1. A polyurethane composition suitable for printing comprising
    A) a polyisocyanate component, which comprises an NCO-terminated polyurethane prepolymer, wherein said NCO-terminated polyurethane prepolymer comprises NCO groups that are primarily aliphatically bonded and wherein said NCO-terminated polyurethane prepolymer is based on a hydroxy-functional compound having an OH functionality in the range of from 1.6 to 2.05;
    B) an isocyanate-reactive polyetherpolyol;
    C) a urethane acrylate and/or urethane methacrylate having at least one aromatic structural unit and a refractive index of greater than 1.50 at 405 nm, wherein said urethane acrylate and/or urethane methacrylate is free of NCO groups and OH groups;
    D) a free radical stabilizer;
    E) a photoinitiator comprising a borate salt and one or more dyes having absorption bands which at least partly cover the spectral range of from 400 to 800 nm;
    F) optionally a catalyst; and
    G) one or more auxiliaries and/or additives comprising a polyester-modified polydimethylsiloxane, a fluorine-modified polymer, a foam-destroying polysiloxane, a hydrophobic solid, a hydrophobic emulsifier, a polyether-modified polymethylalkylsiloxane, a non-ionic polyacrylate copolymer, or mixtures thereof.

2. The polyurethane composition of claim 1, wherein the prepolymer in A) comprises a urethane or allophanate of an aliphatic isocyanate-functional compound and an oligomeric or polymeric isocyanate-reactive compound, and wherein the prepolymer has a number average molar mass of from 200 to 10,000 g/mol and an NCO functionality of from 1.9 to 5.0.

3. The polyurethane composition of claim 1, wherein the isocyanate-reactive polyether polyol B) comprises a difunctional polyetherpolyol based on propylene oxide and ethylene oxide and has a proportion of less than 10% by weight, based on the total mass of the polyether polyol, of repeating units derived from ethylene oxide and a number average molar mass of from 2000 to 4200 g/mol.

4. The polyurethane composition of claim 1, wherein the urethane acrylate C) comprises an adduct of an aromatic triisocyanate or a trimer of an aromatic diisocyanate with hydroxyethyl acrylate, hydroxypropyl acrylate, or 4-hydroxybutyl acrylate.

5. The polyurethane composition of claim 1 comprising
    A) from 15 to 30% by weight of the polyisocyanate component;
    B) from 30 to 56.96% by weight of the isocyanate-reactive polyetherpolyol;
    C) from 20 to 35% by weight of the urethane acrylate and/or urethane methacrylate;
    D) from 0.01 to 0.5% by weight of the free radical stabilizer;
    E) from 1 to 3% by weight of the photoinitiator, of which is from 0.01 to 0.2% by weight of each of the blue-sensitive dye, the green sensitive dye, and the red sensitive dye;
    F) from 0 to 1% by weight of the catalyst; and
    G) from 7 to 20% by weight of the one or more auxiliaries and/or additives.

6. A process for printing on a substrate comprising printing a printing ink comprising the polyurethane composition of claim 1 to a support layer thereby forming a photopolymer layer on the support layer.

7. The process of claim 6, wherein the support layer is based on a compound selected from the group consisting of polycarbonate, polyethylene terephthalate, polybutylene terephthalate, polyethylene, polypropylene, cellulose acetate, cellulose hydrate, cellulose nitrate, a cycloolefin polymer, polystyrene, a polyepoxide, polysulfone, cellulose triacetate, polyamide, polymethyl methacrylate, polyvinyl chloride, polyvinyl butyral, polydicyclopentadiene, and mixtures thereof.

8. The process of claim 6, wherein the support layer is in the form of a film laminate or coextrudate.

9. The process of claim 6, wherein the photopolymer layer has a total layer thickness of from 3 to 100 μm.

10. The process of claim 6, further comprising applying a covering layer to the photopolymer layer after the photopolymer layer is printed on the support layer.

11. The process of claim 6, wherein the covering layer is based on the same material as the support layer.

12. A printed article obtained by the process of claim 6.

13. A process for recording a visual hologram comprising exposing the printed article of claim 12.

14. An optical element, image, or display comprising the printed article of claim 12.

15. A media or holographic film obtained by the process of claim 13.

16. The polyurethane composition of claim 1, wherein the prepolymer in A) comprises a urethane or allophanate of an aliphatic isocyanate-functional compound and an oligomeric or polymeric isocyanate-reactive compound, and wherein the prepolymer has a number average molar mass of from 200 to 10,000 g/mol and an NCO functionality of from 1.9 to 5.0, wherein the isocyanate-reactive polyether polyol B) comprises a difunctional polyetherpolyol based on propylene oxide and ethylene oxide and has a proportion of less than 10% by weight, based on the total mass of the polyether polyol, of repeating units derived from ethylene oxide and a number average molar mass of from 2000 to 4200 g/mol, and wherein the urethane acrylate C) comprises an adduct of an aromatic triisocyanate or a trimer of an aromatic diisocyanate with hydroxyethyl acrylate, hydroxypropyl acrylate, or 4-hydroxybutyl acrylate.

* * * * *